(12) United States Patent
Jing et al.

(10) Patent No.: US 11,410,829 B1
(45) Date of Patent: Aug. 9, 2022

(54) TEM SAMPLE HOLDER WITH CRYOGENIC COOLING AND BROADBAND RF IRRADIATION

(71) Applicant: Euclid Beamlabs, LLC, Solon, OH (US)

(72) Inventors: Chunguang Jing, Naperville, IL (US); Scott Ross, Cary, IL (US); Roman Kostin, Oak Park, IL (US); Yimei Zhu, East Setauket, NY (US)

(73) Assignee: Euclid Beamlabs, LLC, Solon, OH (US)

( * ) Notice: Subject to any disclaimer, the term of this patent is extended or adjusted under 35 U.S.C. 154(b) by 0 days.

(21) Appl. No.: 17/697,034

(22) Filed: Mar. 17, 2022

(51) Int. Cl.
*H01J 37/20* (2006.01)
*H01J 37/26* (2006.01)

(52) U.S. Cl.
CPC ............. *H01J 37/20* (2013.01); *H01J 37/26* (2013.01); *H01J 2237/026* (2013.01); *H01J 2237/2001* (2013.01); *H01J 2237/24585* (2013.01)

(58) Field of Classification Search
CPC ........ H01J 37/28; H01J 37/222; H01J 37/244; H01J 2237/24475; H01J 2237/24571; H01J 2237/2817; H01J 2237/221; H01J 2237/2804; H01J 2237/281; H01J 37/3026; G01N 23/2251; H01L 22/12; G01B 15/02
See application file for complete search history.

(56) References Cited

U.S. PATENT DOCUMENTS

| | | | |
|---|---|---|---|
| 8,089,053 B1* | 1/2012 | Finch | H01J 37/20 850/52 |
| 11,069,507 B2* | 7/2021 | Katz | H01J 37/26 |
| 11,217,425 B2* | 1/2022 | Straw | H01J 37/26 |
| 2013/0118896 A1* | 5/2013 | Foster | G01N 1/32 204/298.36 |
| 2017/0345627 A1* | 11/2017 | Mitchels | H01J 37/285 |
| 2018/0057852 A1* | 3/2018 | Takats | H01J 49/0422 |
| 2020/0411282 A1* | 12/2020 | Straw | H01J 37/20 |

* cited by examiner

*Primary Examiner* — David A Vanore
(74) *Attorney, Agent, or Firm* — Maine Cernota & Rardin

(57) ABSTRACT

A TEM sample holder enables simultaneous cooling and RF irradiation of a sample. The sample is suspended in a hole that penetrates through a sample stage formed by a dielectric plate having a lower metallic ground layer and an upper metallic lead. The sample stage is supported by an evacuated hollow tube extending from a cryogenic chamber, such as a liquid nitrogen or helium Dewar. A coaxial conductor extends from an ambient connector through the cryogenic chamber and hollow tube to the sample stage, a center conductor and surrounding metallic shield thereof being in thermal and electrical communication with the metallic lead and metallic ground layer respectively of the sample stage, and the metallic shield being is in direct thermal communication with the cryogenic chamber. The coaxial conductor thereby enables simultaneous cooling and RF irradiation of the sample during TEM measurements. Embodiments include a temperature sensor and heater.

16 Claims, 11 Drawing Sheets

TEM SAMPLE HOLDER WITH CRYOGENIC COOLING AND BROADBAND RF IRRADIATION

STATEMENT OF GOVERNMENT INTEREST

Portions of the present invention may have been made in conjunction with Government funding under NIH SBIR Phase II Grant #1R43GM133267-02, and there may be certain rights to the Government.

FIELD OF THE INVENTION

The invention relates to transmission electron microscopes (TEMs), and more particularly, to sample holders for TEMs.

BACKGROUND OF THE INVENTION

Electron microscopy, including transmission electron microscopy (TEM) is regarded as an essential tool for many fields of nanoscience research, including condensed matter physics as well as biological and materials sciences. In TEM, electrons are applied to a sample that is positioned within a vacuum, and an image is formed from the interaction of the electrons with the sample as the electrons are transmitted through the sample.

In some cases, it is desirable to apply TEM to samples under variable conditions. For example, cryogenic transmission electron microscopy (Cryo-TEM) employs a specimen holder that is capable of maintaining the specimen at cryogenic temperatures such as liquid nitrogen or liquid helium temperature. This allows imaging of specimens prepared in vitreous ice, which is a preferred preparation technique for imaging individual molecules or macromolecular assemblies, as well as imaging of vitrified solid-electrolyte interfaces, and imaging of materials that are volatile in high vacuum at room temperature, such as sulfur.

It can also be desirable to apply TEM to samples while simultaneously applying RF or microwave energy or electrical pulses. For example, it can be desirable to implement stroboscopic pump and probe experiments, wherein the sample is imaged synchronously with the delivery of pulsed electrons to the sample. Conventionally in situ transmission electron microscopy (TEM) has not been able to adequately investigate electrical stimuli in the radiofrequency (RF) or microwave regime. While many modern electronic devices employ RF signals, this lack of existing in situ capabilities in the RF regime has hindered TEM characterization of such devices, for example, to microscopically investigate interactions between RF stimuli and materials.

However, with reference to FIGS. 1A and 1B, a TEM sample carrier has been proposed that is able to transmit radio frequency energy to a sample 102 while it is being imaged in a TEM. The sample carrier includes a specimen stage 100 comprising a dielectric substrate 104 having a conductive layer that forms a coplanar waveguide with RF leads 106 extending to the sample 102. The specimen stage 100 is mounted to a TEM sample positioner 108, which supports the specimen stage 100 within the vacuum chamber of the TEM microscope, and provides a plurality of electrical leads 110 that extend between the leads 106 of the specimen stage 100 and an RF input 112 that is external to the vacuum chamber and exposed to the ambient environment.

While cryogenic and RF transmitting TEM sample holders are separately known, no solution has been previously proposed that combines cryogenic sample cooling with broadband RF or microwave sample excitation. This inability to combine cryogenic cooling with RF irradiation has inhibited the application of TEM to certain fields of research, such as quantum science research, in which quantum bits or "Q-bits" are implemented as RF circuits that operate at frequencies of a few GHz while being cooled to cryogenic temperatures.

What is needed, therefore, is a TEM sample holder that can be used to apply radio frequency energy to a cryogenically cooled sample within a TEM.

SUMMARY OF THE INVENTION

The present invention is a TEM sample holder that is able to apply radio frequency energy to a sample within a TEM, while at the same time cryogenically cooling the sample. It should be noted that, unless otherwise required by context, the terms "radio frequency" and "RF" are used herein to refer to all electronic frequencies from zero Hz to 10 GHz.

According to the present invention, the disclosed TEM sample holder includes a specimen stage that is supported within the TEM vacuum space by a sample positioner. A vacuum coaxial conductor extends from an external, ambient RF connector through a cryogenic chamber to the specimen stage. The cryogenic chamber, which in embodiments is a liquid nitrogen or liquid helium Dewar, is filled with a cryogenic liquid that is in direct thermal communication with the coaxial conductor as it passes through the cryogenic chamber. Beyond the cryogenic chamber, the coaxial conductor is surrounded by an evacuated tube that extends to the specimen stage and minimizes heat exchange with the environment. The cryogenic chamber and evacuated tube function together as a sample positioner that supports and positions the specimen stage within the TEM vacuum space.

The coaxial conductor includes a relatively thick central wire or rod that is coaxially surrounded by a relatively thick tubular metallic shield, the rod being separated from the shield by an annular vacuum space, or by a dielectric insulator such as Kapton®. In embodiments, the central wire or rod has a diameter of between 0.01 inches and 0.05 inches, and the metallic shield has a diameter of between 0.05 and 0.2 inches, with a thickness of between 0.01 and 0.02 inches. The central rod and shield are both made from one or more electrically and thermally conductive metals, such as copper, silver, or gold. As a result of the thickness of the coaxial rod and shield, the coaxial conductor is able to function both as an RF conductor and as a thermal conductor, so that the coaxial conductor can convey RF energy to a sample while also simultaneously cryogenically cooling the sample. A strip line conductor would not be able to provide this dual functionality, because the leads of a strip line conductor would be much too thin to efficiently conduct heat away from the sample.

The specimen stage is a flat dielectric plate that is covered on a lower side thereof by a solid ground plane, while at least one RF lead is provided on an upper side thereof. The RF lead is in electrical and thermal communication with the central rod of the coaxial conductor, and the ground plane is in electrical and thermal communication with the surrounding shield of the coaxial conductor. In embodiments, the coaxial conductor and specimen stage maintain a 50 Ohm impedance at frequencies up to 6 GHZ over the entire conducting path from the external connector to the sample.

The specimen stage is penetrated by an imaging hole within which a sample can be positioned. In embodiments,"

the imaging hole is surrounded by a recessed shelf that can support margins of the sample, thereby holding the sample in place over the imaging hole. Electrical and thermal communication is provided between the underlying ground plane and the sample, and between the electrical lead and the sample, thereby providing both thermal and RF communication with the sample.

In embodiments, the specimen stage further comprises a temperature sensor and/or heater that are configured to monitor and control the sample temperature. Electrical communication between the sensor and/or heater and an external temperature monitor and controller is provided by connecting wires that extend through vacuum feedthroughs into the exterior environment.

The present invention is a sample holder for a Transmission Electron Microscope (TEM). The sample holder is configured to provide simultaneous cooling and RF irradiation to a sample while the sample is being exposed to electrons applied thereto by the TEM. The sample holder includes a sample stage comprising a flat dielectric plate, a metallic ground layer applied to a lower side of the dielectric plate, at least one metallic lead applied to an upper side of the dielectric plate, and a sample hole penetrating through the flat dielectric plate and ground layer, the sample hole being configured to surround a TEM sample while electrons are applied to the TEM sample by the TEM, the sample being in RF and thermal communication with the metallic ground layer and metallic lead.

The sample holder further includes a cryogenic chamber comprising a cryogenic container that is configured to contain a cryogenic liquid, an evacuated hollow tube extending from the cryogenic chamber to the sample stage, and a coaxial conductor extending from an ambient connector through the cryogenic chamber and hollow tube to the sample stage. The coaxial conductor includes a metallic central conductor, and a metallic shield encircling the central conductor, the central conductor and the shield being separated by an annular gap.

The metallic shield is in electrical and thermal communication with the ground layer and the central conductor is in electrical and thermal communication with the at least one metallic lead, and the metallic shield is in thermal communication with the cryogen that is contained within the cryogenic chamber, the coaxial conductor being thereby able to simultaneously cool the sample and conduct RF energy to the sample while the electrons are being applied to the sample by the TEM.

In embodiments, the metallic shield is in physical contact with a wall of a tunnel that extends through the cryogenic container.

In any of the above embodiments, a diameter of the metallic central conductor can be greater than 0.01 inches.

In any of the above embodiments, a diameter of the metallic shield can be greater than 0.05 inches.

In any of the above embodiments, a thickness of the metallic shield can be great than 0.01 inches.

In any of the above embodiments, the cryogenic chamber can be a liquid nitrogen Dewar or a liquid helium Dewar.

Any of the above embodiments can further include a recessed shelf surrounding the sample hole.

In any of the above embodiments, the gap between the metallic central conductor and the metallic shield can be evacuated, or filled with a dielectric material.

In any of the above embodiments, the hollow tube and the sample stage can be joined by a joining element, the joining element comprising a metallic outer portion that interconnects the metallic shield with the ground layer, and a central passage surrounded by a dielectric insulator through which the metallic central conductor extends from the hollow tube to electrical and thermal connection with the at least one metallic lead.

In any of the above embodiments, the at least one metallic lead can be a strip line lead.

Any of the above embodiments can further include a temperature sensor configured to sense a temperature of the sample. In some of these embodiments the temperature sensor comprises a microstrip line on the dielectric plate.

Any of the above embodiments can further include a heater configured to control a temperature of the sample.

In any of the above embodiments, the heater can comprise a microstrip line on the dielectric plate.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present invention is a TEM sample holder that is able to apply radio frequency energy to a sample within a TEM while at the same time cryogenically cooling the sample. It should be noted that, unless otherwise required by context, the terms "radio frequency" and "RF" are used herein to refer to all electronic frequencies from zero Hz to 10 GHz.

Figure 1A:
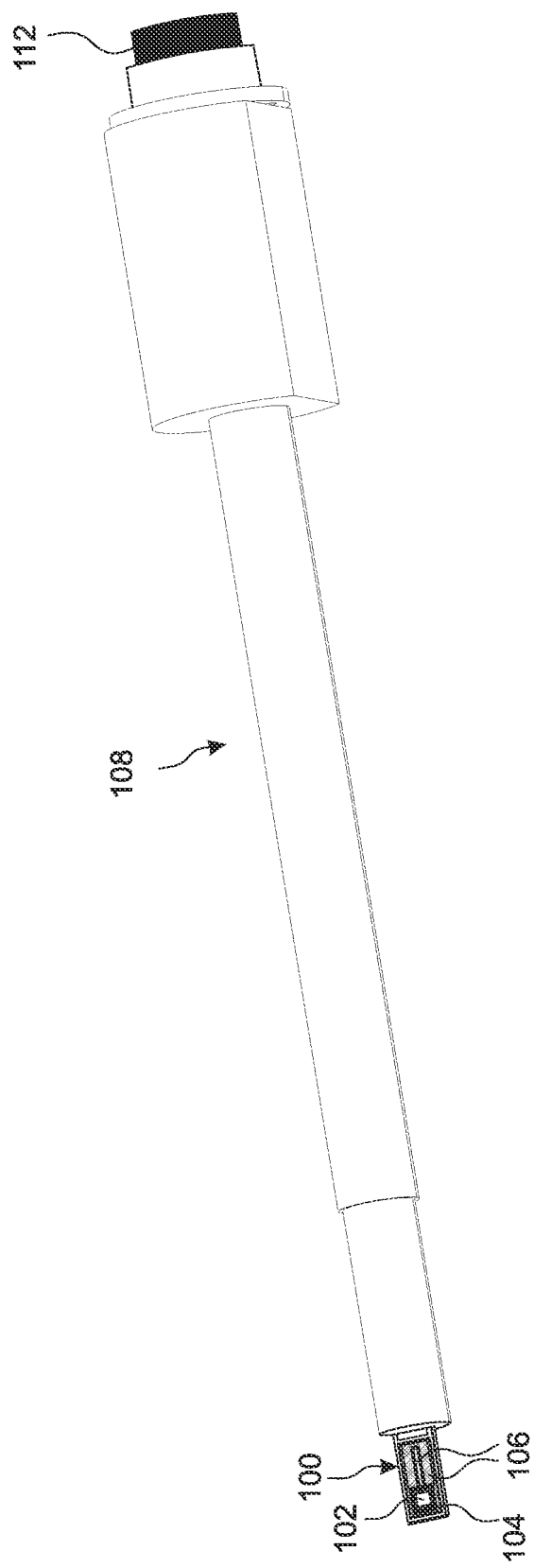
FIG. 1A is a perspective view of a prior art cryogenic TEM sample holder.
Figure 1B:
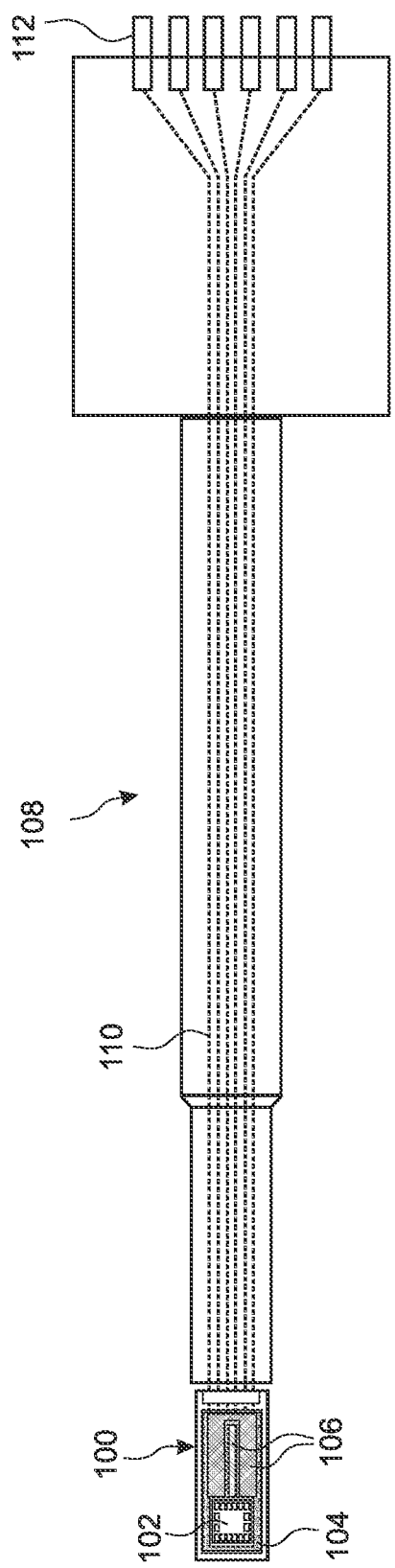
FIG. 1B is a cross-sectional view of the prior art cryogenic TEM sample holder of FIG. 1A.
Figure 2:
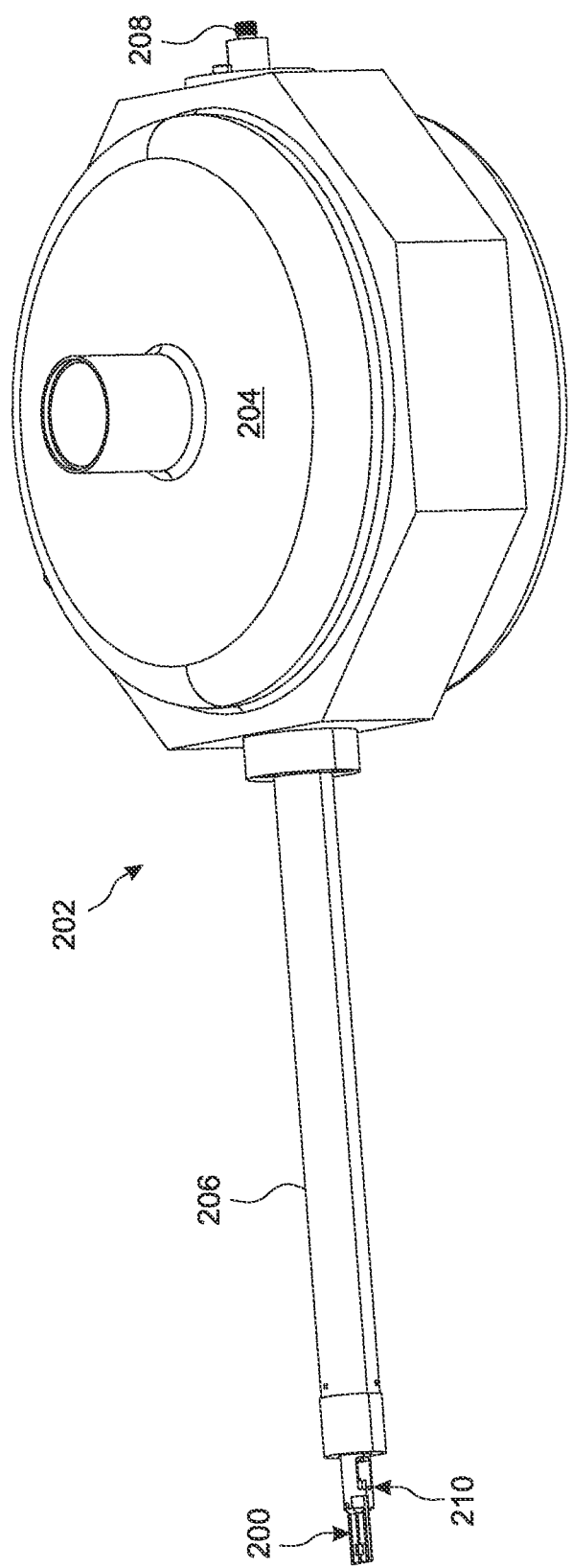
FIG. 2 is a perspective view, drawn to scale, of an embodiment of the present invention.
Figure 3:
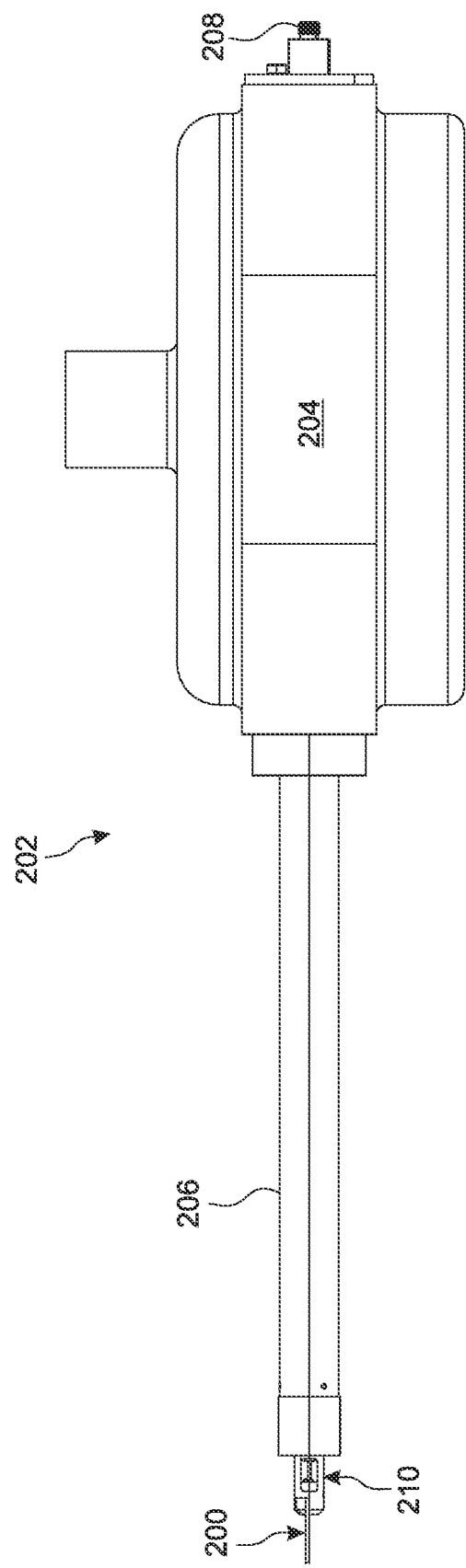
FIG. 3 is side view, drawn to scale, of the embodiment of FIG. 2.

With reference to FIGS. 2 and 3, according to the present invention a TEM sample holder includes a specimen stage 200 that is supported within the TEM vacuum space by a sample positioner 202. The sample positioner 202 comprises a cryogenic chamber 204 and an evacuated hollow tube 206 extending from the cryogenic chamber 204 to the specimen stage 200. In the illustrated embodiment, the hollow tube 206 is connected to the sample stage 200 by a joining section 210 that provides electrical and thermal interconnection as described in more detail below.

Figure 4:
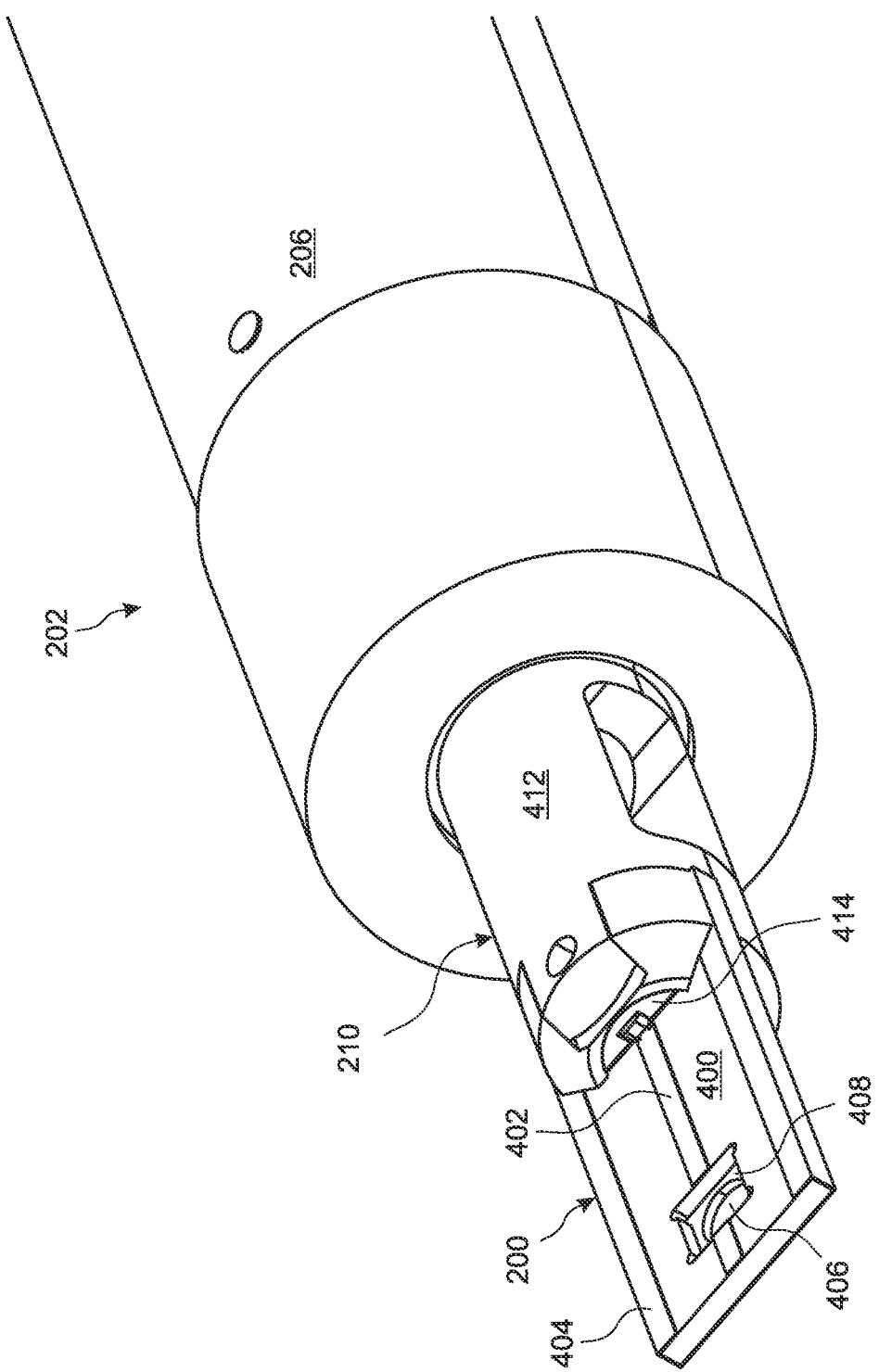
FIG. 4 is a perspective view from above, drawn to scale, of the sample stage portion of the embodiment of FIG. 2.
Figure 5:
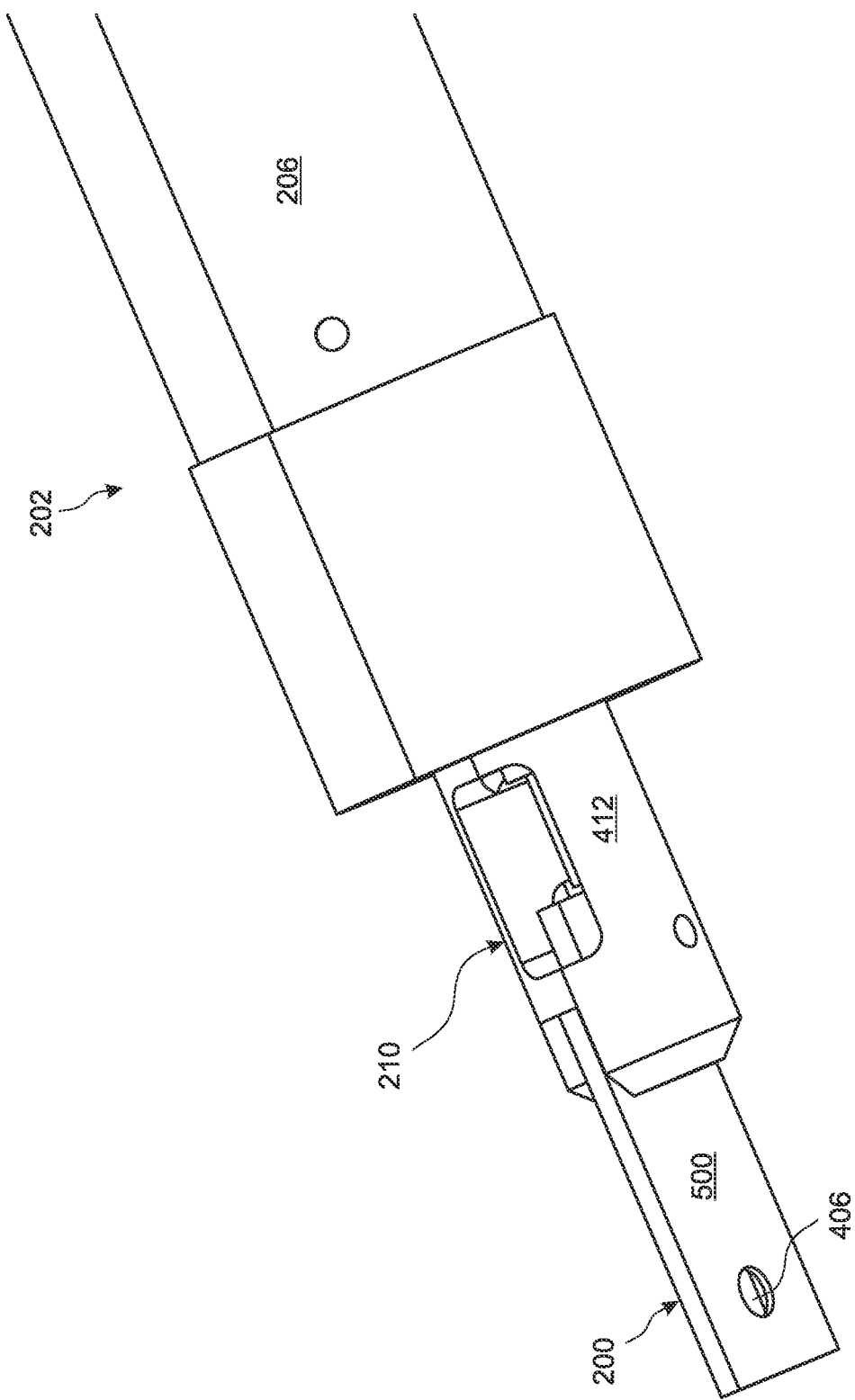
FIG. 5 is a perspective view from below, drawn to scale, of the sample stage portion of the embodiment of FIG. 2.
Figure 6:
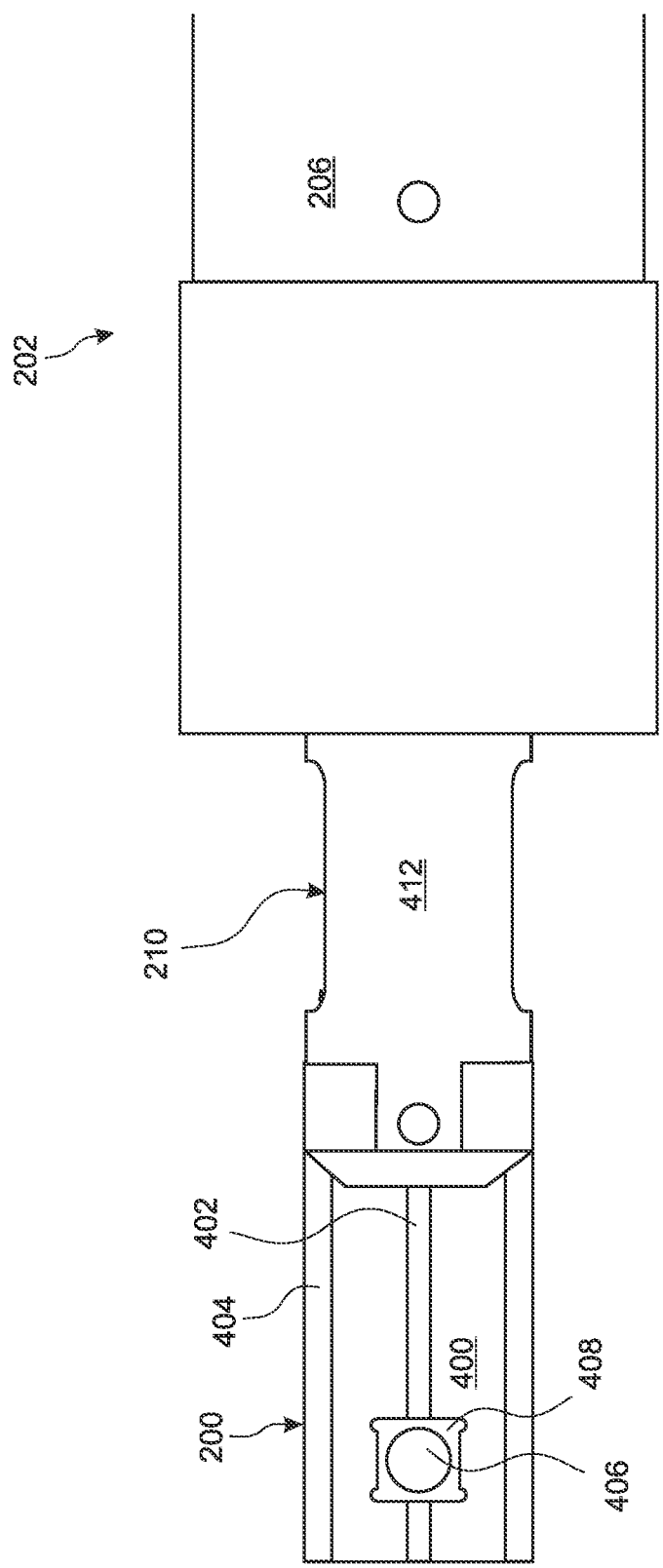
FIG. 6 is a top view, drawn to scale, of the sample stage portion of the embodiment of FIG. 2.

With reference to FIGS. 4 and 5, The specimen stage 200 comprises a flat dielectric plate 400 that is covered on a lower side thereof by a solid ground plane 500, while at least one RF lead 402 is provided on an upper side thereof. In the illustrated embodiment, the central lead 402 is provided down the center of the flat dielectric plate 400, while a pair of ground leads 404 extend along right and left sides of the flat dielectric plate 400. The thickness of dielectric slab, the width of central lead 402, and the space between the center lead 402 and the ground leads 404, are chosen according to calculated values that provide a 50-ohm microstrip line extending from the coaxial conductor 700 to the sample.

The flat dielectric plate 400 of the specimen stage 200 is penetrated by an imaging hole 406 within which a sample can be positioned. In the illustrated embodiment, the imaging hole 406 is surrounded by a recessed shelf 408 that can support margins of the sample, thereby holding the sample in place over the imaging hole 404. Electrical and thermal communication is provided between the underlying ground plane 500 and the sample, and between the electrical lead 402 and the sample, thereby providing both thermal and RF communication with the sample.

Figure 7:
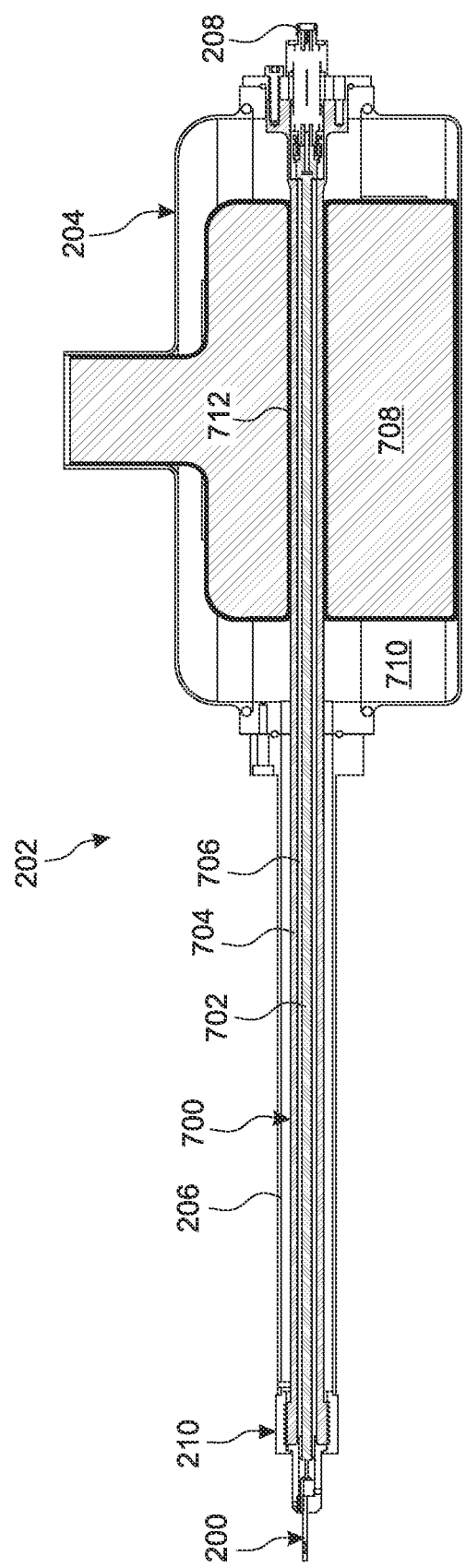
FIG. 7 is a cross-sectional side view, drawn to scale, of the embodiment of FIG. 2.
Figure 8:
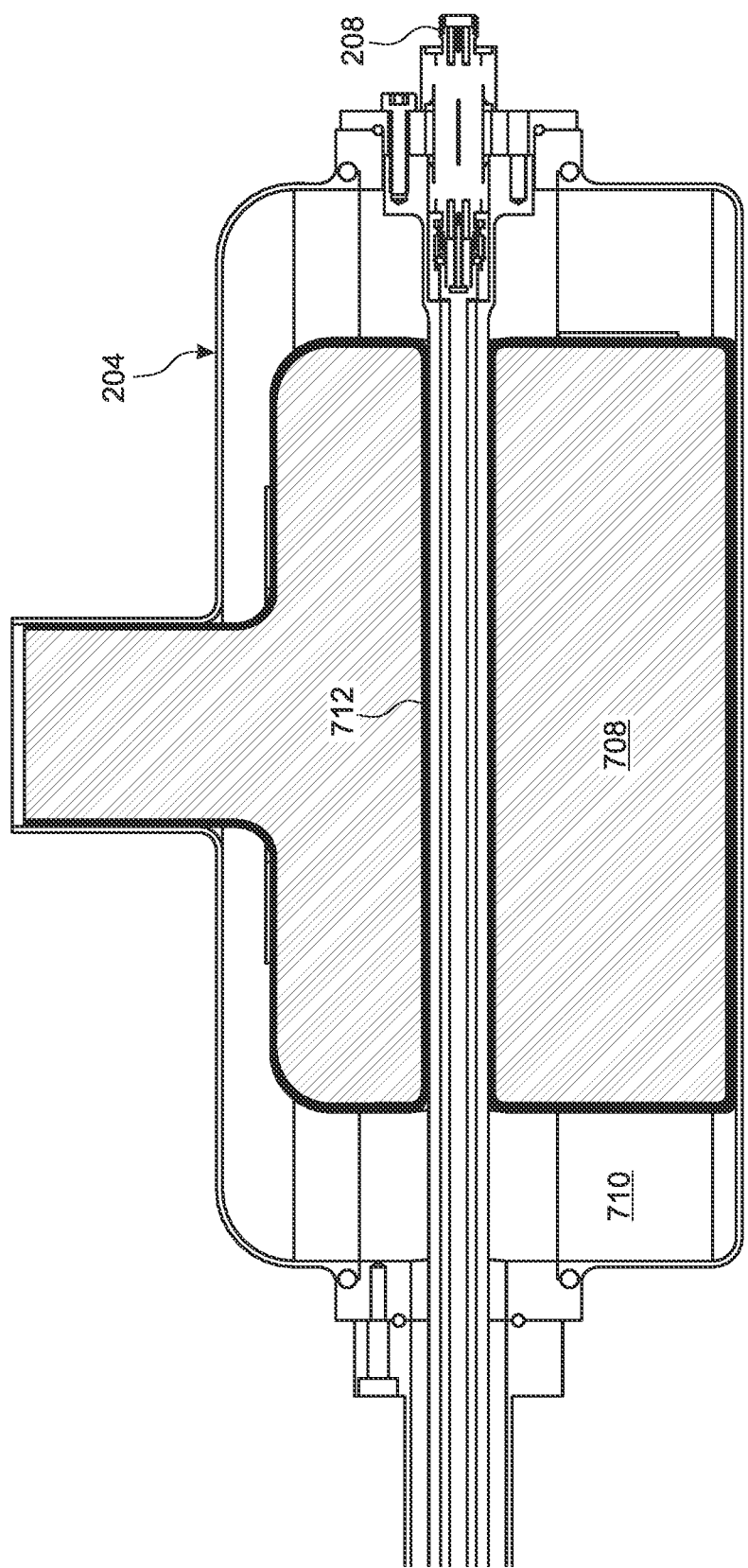
FIG. 8 is a cross-sectional side view, drawn to scale, of the cryogenic chamber portion of the embodiment of FIG. 2.
Figure 9:
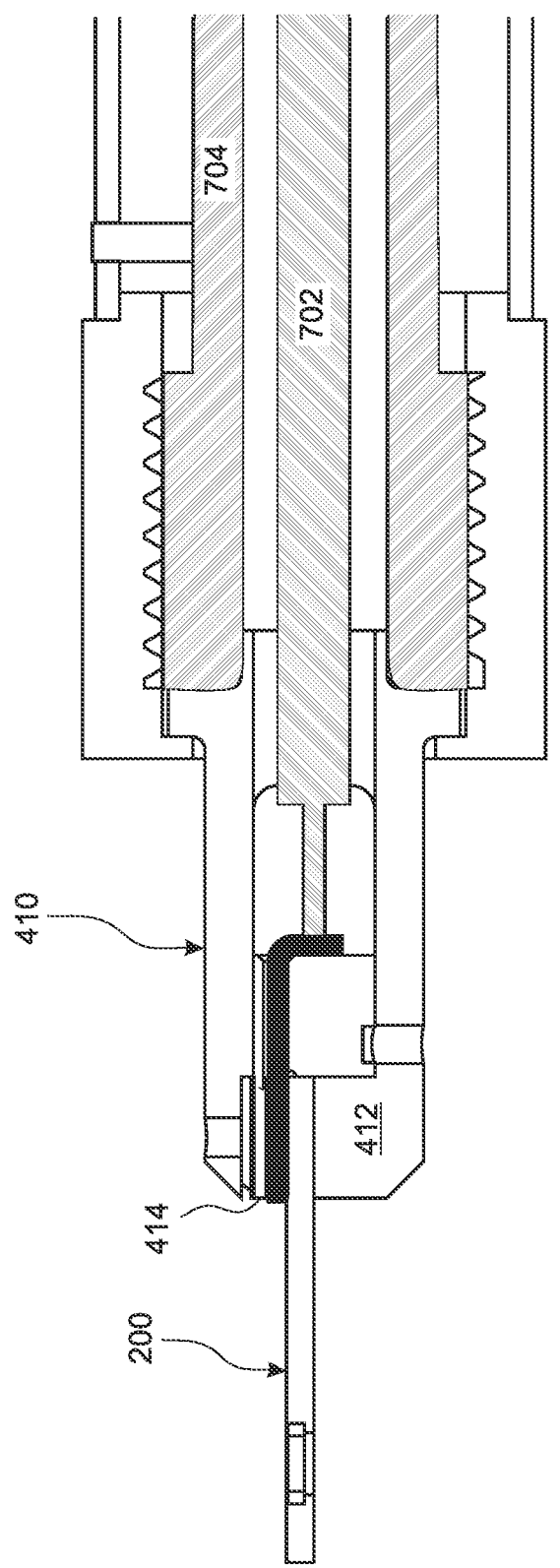
FIG. 9 is a cross-sectional side view, drawn to scale, of the sample stage portion of the embodiment of FIG. 2.

With reference to the cross-sectional illustrations of FIGS. 7 through 9, a vacuum coaxial conductor 700 extends from an external, ambient RF connector 208 through the cryogenic chamber 204 and the hollow tube 206 to the specimen stage 200. The coaxial conductor 700 includes a relatively thick central wire or rod 702 that is coaxially surrounded by a relatively thick tubular metallic shield 704, the rod 702 being separated from the shield 704 by an annular vacuum space or by a dielectric insulator such as Kapton® 706. In embodiments, the central wire or rod has a diameter of between 0.01 inches and 0.05 inches, and the metallic shield has a diameter of between 0.05 and 0.2 inches, with a thickness of between 0.01 and 0.02 inches.

The cryogenic chamber 204, which in embodiments is a liquid nitrogen or liquid helium Dewar, includes an interior cryogenic container 708 that is filled with a cryogenic liquid and surrounded by a vacuum space 710. In the illustrated embodiment, the coaxial conductor 700 passes through a tunnel 712 that is provided through the cryogenic container 706 of the cryogenic chamber 204. Within the tunnel 712, the shield 704 of the coaxial conductor 700 is in direct physical contact with the walls of the tunnel 712, such that the coaxial conductor 700 is in direct thermal communication with the cryogenic liquid. Beyond the cryogenic chamber 204, the coaxial conductor 700 is surrounded by the evacuated hollow tube 206, thereby minimizing heat exchange between the coaxial conductor 700 and the environment. The cryogenic chamber 204 and evacuated tube 206, together with the coaxial conductor 700 extending therethrough, function together as a sample positioner 202 that supports and positions the specimen stage 200 within the TEM vacuum space.

The central rod 702 and shield 704 of the coaxial conductor 700 are both made from one or more electrically and thermally conductive metals, such as copper, silver, or gold. As a result of the thickness of the coaxial rod 702 and shield 704, the coaxial conductor 700 is able to function both as an RF conductor and a thermal conductor, whereby the coaxial conductor 700 conveys RF energy to the sample while also simultaneously cryogenically cooling the sample. A strip line conductor 110 would not be able to provide this dual functionality, because the leads of a strip line conductor 110 would be much too thin to efficiently conduct heat away from the sample.

The joining section 210 that joins the hollow tube 206 to the sample stage 200 comprises an outer portion 412 that is made from a thermally conductive metal, such as copper. The outer portion is in strong thermal and electrical communication with the shield 704 of the coaxial conductor 700 and with the ground plane 500 and ground leads 404 of the sample stage 200. Within the joining section 210 the central rod 702 of the coaxial conductor 700 extends into electrical and thermal contact with the central lead 402 of the sample stage 200, while being isolated from the outer portion 412 by a dielectric spacer 414. The joining section 210 thereby places the RF lead 216 of the sample stage 200 into both electrical and thermal communication with the central rod 402 of the coaxial conductor 700, while also placing the ground plane 500 and ground leads 404 into electrical and thermal communication with the surrounding shield 704 of the coaxial conductor 700. In embodiments, the coaxial conductor 700, joining section 210, and specimen stage 200 maintain a 50-ohm RF impedance at frequencies up to 6 GHZ over the entire RF path extending from the external connector 208 to the sample.

Figure 10:
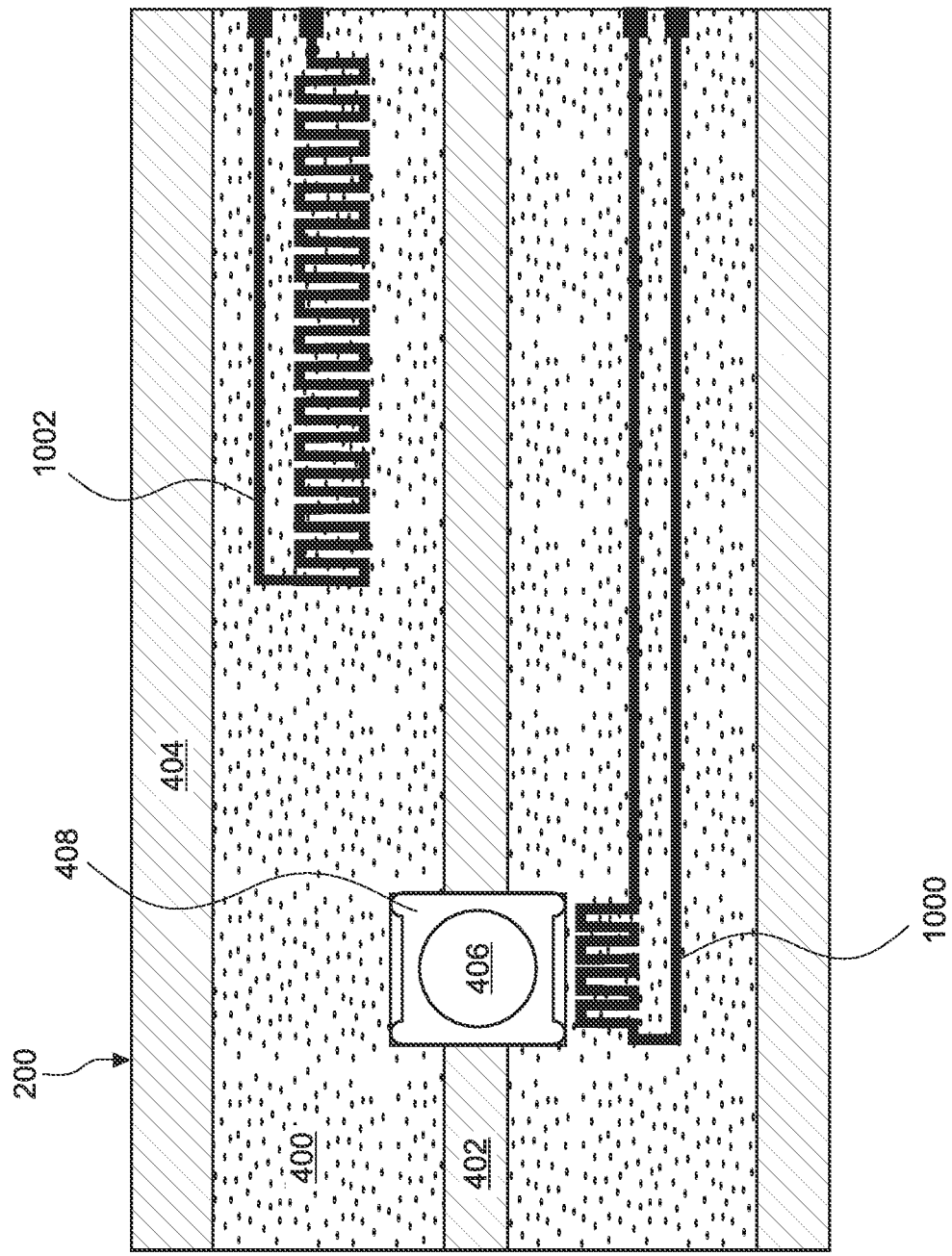
FIG. 10 is a top view of a sample stage in an embodiment that includes a temperature sensor and heater.

With reference to FIG. 10, in embodiments the specimen stage 200 further comprises a temperature sensor 1000 and heater 1002 that are configured to monitor and control the sample temperature. In the illustrated embodiment, both the temperature sensor 1000 and heater 1002 are implemented as "zig-zag" microstrip lines on the dielectric plate 400. In similar embodiments, the temperature sensor 100 and/or heater 1002 have other shape configurations, and are not necessarily provided as microstrip lines.

Electrical communication between the temperature sensor 1000 and/or heater 1002 and an external temperature monitor and controller (not shown) is provided by connecting wires (not shown) that extend through vacuum feedthroughs into the exterior environment. In the illustrated embodiment, both the sensor 1000 and the heater 1002 are resistive. In other embodiments other types of sensors and heaters are used, as are known in the art.

he foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. A sample holder for a Transmission Electron Microscope (TEM), the sample holder being configured to provide simultaneous cooling and RF irradiation to a sample while the sample is being exposed to electrons applied thereto by the TEM, the sample holder comprising:
- a sample stage comprising:
  - a flat dielectric plate;
  - a metallic ground layer applied to a lower side of the dielectric plate;
  - at least one metallic lead applied to an upper side of the dielectric plate; and
  - a sample hole penetrating through the flat dielectric plate and ground layer, the sample hole being configured to surround a TEM sample while electrons are applied to the TEM sample by the TEM, the sample being in RF and thermal communication with the metallic ground layer and metallic lead;
- a cryogenic chamber comprising a cryogenic container that is configured to contain a cryogenic liquid;
- an evacuated hollow tube extending from the cryogenic chamber to the sample stage; and
- a coaxial conductor extending from an ambient connector through the cryogenic chamber and hollow tube to the sample stage, the coaxial conductor comprising:
  - a metallic central conductor; and
  - a metallic shield encircling the central conductor, the central conductor and the shield being separated by an annular gap;
- wherein:
  - the metallic shield is in electrical and thermal communication with the ground layer and the central conductor is in electrical and thermal communication with the at least one metallic lead; and
  - the metallic shield is in thermal communication with the cryogen that is contained within the cryogenic chamber;
- the coaxial conductor being thereby able to simultaneously cool the sample and conduct RF energy to the sample while the electrons are being applied to the sample by the TEM.

2. The sample holder of claim 1, wherein the metallic shield is in physical contact with a wall of a tunnel that extends through the cryogenic container.

3. The sample holder of claim 1, wherein a diameter of the metallic central conductor is greater than 0.01 inches.

4. The sample holder of claim 1, wherein a diameter of the metallic shield is greater than 0.05 inches.

5. The sample holder of claim 1, wherein a thickness of the metallic shield is great than 0.01 inches.

6. The sample holder of claim 1, wherein the cryogenic chamber is a liquid nitrogen Dewar.

7. The sample holder of claim 1, wherein the cryogenic chamber is a liquid helium Dewar.

8. The sample holder of claim 1, further comprising a recessed shelf surrounding the sample hole.

9. The sample holder of claim 1, wherein the gap between the metallic central conductor and the metallic shield is evacuated.

10. The sample holder of claim 1, wherein the gap between the metallic central conductor and the metallic shield is filled with a dielectric material.

11. The sample holder of claim 1, wherein the hollow tube and the sample stage are joined by a joining element, the joining element comprising a metallic outer portion that interconnects the metallic shield with the ground layer, and a central passage surrounded by a dielectric insulator through which the metallic central conductor extends from the hollow tube to electrical and thermal connection with the at least one metallic lead.

12. The sample holder of claim 1, wherein the at least one metallic lead is a strip line lead.

13. The sample holder of claim 1, further comprising a temperature sensor configured to sense a temperature of the sample.

14. The sample of claim 13, wherein the temperature sensor comprises a microstrip line on the dielectric plate.

15. The sample of claim 1, further comprising a heater configured to control a temperature of the sample.

16. The sample of claim 15, wherein the heater comprises a microstrip line on the dielectric plate.

* * * * *